United States Patent [19]

Corliss

[11] Patent Number: 5,280,437
[45] Date of Patent: Jan. 18, 1994

[54] STRUCTURE AND METHOD FOR DIRECT CALIBRATION OF REGISTRATION MEASUREMENT SYSTEMS TO ACTUAL SEMICONDUCTOR WAFER PROCESS TOPOGRAPHY

[75] Inventor: Daniel A. Corliss, Leominster, Mass.

[73] Assignee: Digital Equipment Corporation, Hudson, Mass.

[21] Appl. No.: 723,170

[22] Filed: Jun. 28, 1991

[51] Int. Cl.[5] ............................................. G01B 11/00
[52] U.S. Cl. ................................. 364/559; 364/571.01; 356/401
[58] Field of Search .................... 364/559, 571.01, 489, 364/490; 358/107; 382/8, 10; 356/401

[56] References Cited

U.S. PATENT DOCUMENTS

| | | | |
|---|---|---|---|
| 3,584,960 | 6/1971 | Seailles | 356/164 |
| 4,095,112 | 6/1978 | Trotel | 250/492 A |
| 4,376,584 | 3/1983 | Hart et al. | 356/401 |
| 4,388,386 | 6/1983 | King et al. | 430/5 |
| 4,390,788 | 6/1983 | Hayashi et al. | 250/491.1 |
| 4,430,571 | 2/1984 | Smith et al. | 250/492.2 |
| 4,442,361 | 4/1984 | Zasio et al. | 250/491.1 |
| 4,710,440 | 12/1987 | Del Priore | 430/5 |
| 4,737,920 | 4/1988 | Ozawa | 364/490 |
| 4,803,644 | 2/1989 | Frazier et al. | 364/559 |
| 4,833,621 | 5/1989 | Umatate | 364/491 |
| 4,938,600 | 7/1990 | Into | 356/401 |

Primary Examiner—Thomas G. Black
Assistant Examiner—Michael Zanelli
Attorney, Agent, or Firm—Arnold, White & Durkee

[57] ABSTRACT

To calibrate a registration measurement system for use in semiconductor fabrication processes, a calibration structure is provided. The calibration structure includes at least one zero offset registration structure and a plurality of non-zero offset registration structures. By measuring the displacement of the zero registration, structure at 0° and 180°, the tool induced shift (TIS) of the registration measurement system may be determined. Then, by measuring the displacement of the zero offset registration structure at 0°, 90°, 180°, and 270° the initial TIS determination is verified and the presence or absence of astigmatism is established. When TIS and astigmatism have been accounted for, all of the registration structures, both zero and non-zero, are measured at an angular orientation of 0° to determine the systematic errors present in the measurement. Once these errors are determined, the registration measurement system is calibrated to alleviate these errors.

18 Claims, 5 Drawing Sheets

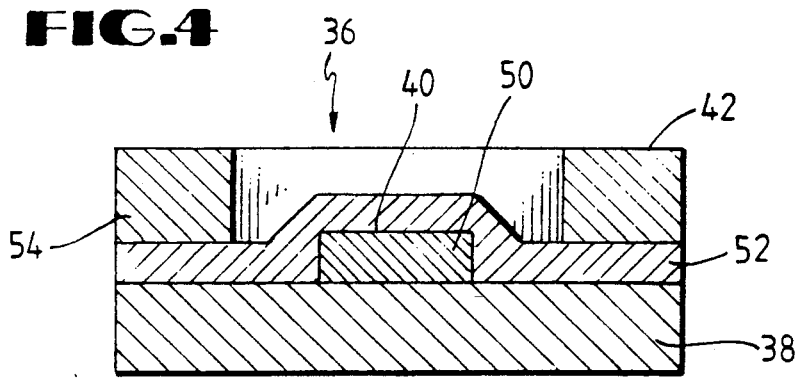
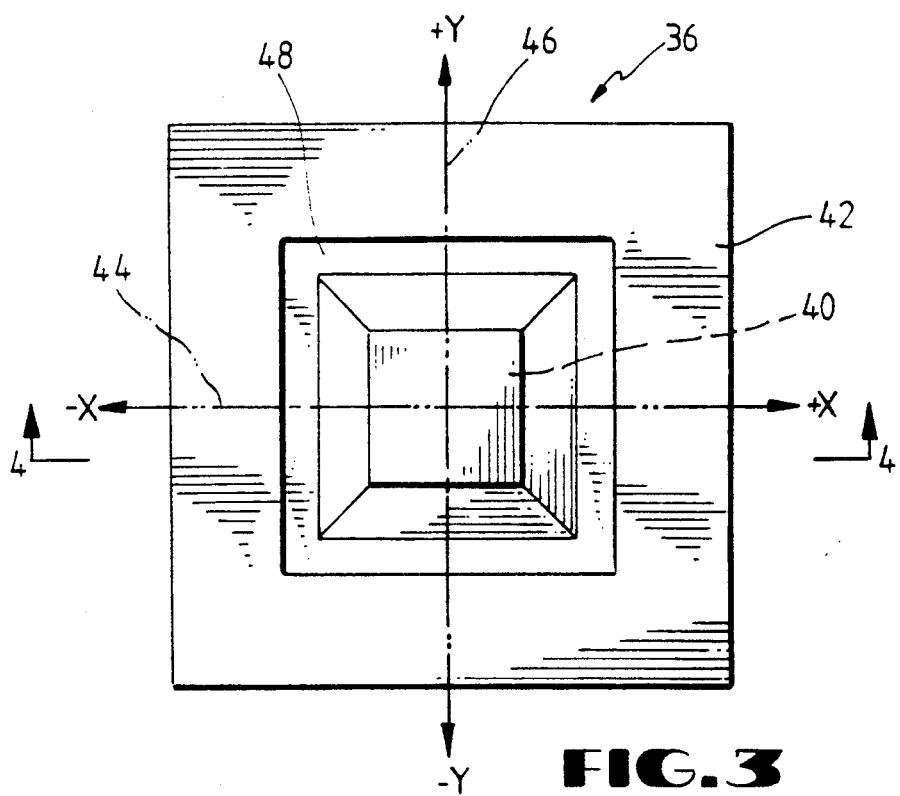

STRUCTURE AND METHOD FOR DIRECT CALIBRATION OF REGISTRATION MEASUREMENT SYSTEMS TO ACTUAL SEMICONDUCTOR WAFER PROCESS TOPOGRAPHY

BACKGROUND OF THE INVENTION

1. Field of the Invention

The present invention relates generally to integrated circuit fabrication and, more particularly, to a method and apparatus for measuring and calibrating the registration between overlying layers of a semiconductor wafer.

1. Description of the Related Art

The fabrication of complex semiconductor devices involves multiple processing steps. Multiple patterned layers of different materials are applied to a substrate to create the desired electronic semiconductor device. The different layers overlie each other and must be accurately registered to ensure proper operation of the semiconductor device. Displacement between corresponding features on different layers can degrade the performance of the device or can cause the device to be totally inoperative. As semiconductor devices have become increasingly complex, the feature dimensions have been correspondingly reduced. This reduction in feature dimensions has reduced acceptable tolerances on displacement between layers.

When a semiconductor device is fabricated, it is one of many chips on a wafer of semiconductor material. An example of a typical fabrication process is described below. First, a silicon wafer with a nitride is patterned and etched. A silicon dioxide layer is grown in the nitride windows, and the nitride is removed. Next, polysilicon is deposited on the wafer, aligned to the previous layer, and then the wafer is again patterned and etched. Then, the wafer is aligned to the previous layer, patterned, and diffused with dopants. After this step, a dielectric is deposited on the wafer, aligned to the previous layer, and then the wafer is again patterned and etched. Finally, a metal layer is deposited on the wafer, aligned to the previous layer, and then patterned and etched.

Higher circuit densities, smaller device sizes, and larger chip sizes have resulted from improved fabrication techniques. These advances require that the circuit patterns used for each step of the fabrication process be made more accurately so that they align with one another more precisely. To assist in the registration of overlying layers in semiconductor wafers, it has been common practice to include registration patterns or marks in each layer of the wafer. The patterns overlie each other and have a predetermined relationship when the layers are correctly registered. One commonly used registration pattern includes squares of different sizes on the layers to be registered. When the two layers are exactly registered, the squares are concentric. Any registration error produces a displacement of the squares relative to one another.

Since semiconductor wafers having multiple complex integrated circuits are expensive to fabricate, it is usually desirable to verify registration after the application of each layer to the wafer. If the displacement of the layers is outside tolerable limits, the defective layer can be removed and replaced with an accurately registered layer. Registration measurement, verification, and correction eliminate the scrapping of potentially good yielding wafers.

To avoid misregistration and its resulting expense, the registration must be accurately determined. In the past, it was common practice to verify registration manually. Experienced operators examined the registration of overlying patterns, e.g., typically pairs of bi-layer interleaved comb structures called optical veneers, on each wafer. However, such techniques were relatively slow and subject to human error and contamination of the semiconductor wafers.

More recently, automated systems for measuring registration have been developed. While these automated systems are vast improvements over the previous manual systems, a measurement system, nonetheless, unavoidably introduces certain errors into the measured values. The errors arise both in the optical and electronic portions of the automated systems. No known system can entirely eliminate or compensate for these errors, which are typically referred to as systematic errors.

In the past, it has been customary to calibrate such registration systems by comparing measurements with those obtained from another system, such as a scanning electron microscope (SEM), that is known to be accurate. However, such calibration techniques are relatively complex and require additional expensive equipment. Currently, the ability to calibrate registration measurement systems is limited to three techniques: (1) the indirect single layer design offset technique, (2) the SEM micrograph of multilayered structures technique, and (3) the tool induced shift (TIS) technique. All three techniques are limited in their applications and accuracy.

To describe the limitations of these techniques, the actual structure that is targeted for registration determination, and the conditions in which it is presented to the measurement system, must be described. The actual structure that is being used for registration determination includes an underlyinq substrate, a base layer, a developed photoresist layer, and, in most cases, an intermediary layer which is usually deposited for subsequent processing. An example of a typical measurement structure is formed as a box within a box so that registration measurement may be determined for the photoresist layer to the base layer. The registration measurement is determined by measuring the x and y components of the concentric boxes. The designed geometric center of the two boxes is defined as coordinate (0,0). The actual difference between the center of the inner box and the center of the outer box during wafer processing is the registration offset to be determined. A typical size for the inner box is 10 microns square. A typical size for the inner edge of the outer box is 20 microns square, with the outer edge of the outer box being 50 microns square. While these are not absolute numbers, they are submitted as typical sizes being employed in the industry.

In the single layer offset technique, both the outer and inner boxes are designed at the same layer, i.e., either the base layer or the photoresist layer. Offsets of the outer box relative to the inner box are designed into the structure. There is usually a group of structures with varying offsets in both the x and y directions. These structures are measured and the measured values are plotted against the design values. Equations of best fit are determined and used as calibration curves in the registration measurement system for measuring the actual multi-layer process topography. The limitation of this technique is that it does not represent the actual topography to be measured. Therefore, the calibration of the measurement system does not contain the optical characteristics of the structure to be measured. The most prominent missing optical factor is the optimum focus between the top of the photoresist and the top of the base layer. Other important factors include the refractive index and distortion of an intermediary layer.

The SEM micrograph technique is very difficult to use and limited in its applications and accuracies. This technique uses an SEM to take top-down micrographs of the multi-layered box-in-box structure or similar multi-layered registration structure. The micrographs are then used for measurements of the x and y components of registration. These measurements are determined through manual measurement with calipers and correlation to another SEM micrograph of a "known" standard. If the SEM system has direct measurement capabilities, then the taking and measuring of micrographs is not necessary. Once the SEM measurements of registration have been determined, they are plotted against the measurement system values. Equations of best fit are determined and are used as calibration curves for the registration measurement systems.

Since the SEM is considered to be the measurement standard of the semiconductor industry, one would believe that a calibration to its measurements would be the most accurate. However, there are some variables inherent to a SEM that limit both the applications and accuracy of this technique. First, the SEM is a highly sensitive system that relies on beam stability. Unfortunately, minor fluctuations in beam stability are commonplace and cause astigmatism in the resulting micrograph. Astigmatism results in error in the measurement of x and y registration. Further, it cannot be assumed that micrographs taken at different times have the same inherent beam characteristics.

Second, the SEM gains its notoriety through its ability to resolve very small features. It is assumed that this ability is transferable to the determination of very small differences in orientation. However, the SEM must be at very high magnification to resolve small feature differences. Unfortunately, the registration measurement structures currently employed are designed to be very large to maximize image field utilization and magnification of the registration measurement system, but this large size limits their imaging on an SEM to very low magnification. Therefore, the advantage of the SEM's high resolution is defeated through the use of low magnification.

Third, the SEM's output is the result of bouncing a beam of electrons off of a surface and tracing the paths of the scattered electrons to create an image. Unfortunately, the presence of an intermediary layer will block the beam from reaching the base layer. Therefore, all process levels that have an intermediary layer cannot be calibrated with this technique.

In the TIS technique, the registration measurement system (RMS) takes two measurements of a registration structure to determine the tool induced shift exhibited by the RMS. The first measurement is made with the registration structure at 0° and the second measurement is made with the registration structure rotated by 180°. The TIS calculated from these measurements can compensate subsequent measurements made with the RMS However, the TIS technique compensates for translational offsets only. It does not compensate for systematic magnification and distortion errors such as astigmatism.

The present invention is directed to overcoming, or at least minimizing, one or more of the problems set forth above.

SUMMARY OF THE INVENTION

In accordance with one aspect of the present invention, there is provided a calibration structure for use in calibrating a registration measurement system. The calibration structure includes a first registration structure formed on a substrate. The first registration structure has a first pattern and a second pattern as viewed from a point on a perpendicular to a plane generally defined by the substrate. Each of the first and second patterns has a center, and the displacement between the centers of the first pattern and the second pattern is selected to be zero, absent any integrated circuit fabrication process step induced registration misalignment. In reality, there may be a misalignment due to actual fabrication mask misalignment and/or other process step variances induced by the process steps as actually carried out. The magnitude and direction of this actual misalignment is what is desired to be measured by the registration measurement system, the calibration of which the use of the structure and method of the present invention is intended to facilitate. The calibration structure also includes a plurality of second registration structures each formed on the substrate and located on the substrate in spaced apart relation to one another and to the first registration structure. Each of the second registration structures has a third pattern and a fourth pattern, each having a center in the same viewing plane as the first and second patterns. The centers of each third pattern and its respective fourth pattern are selected to equal a preselected non-zero offset displacement of a known amount in a known direction, again assuming that there are no integrated circuit fabrication process induced misalignments. In reality, the preselected displacements of the centers of the respective third and fourth patterns may be misaligned from the preselected displacement to roughly the same extent as the first and second patterns of the first registration structure are misaligned from concentricity, due to whatever mask misalignments or other process variable misalignments also affected the alignment of the first registration structure.

In accordance with another aspect of the present invention, there is provided a method for calibrating a registration measurement system. The method includes the following steps. A calibration structure is positioned on the registration measurement system in an initial position. The calibration structure has a preselected zero offset registration structure and a plurality of preselected non-zero offset registration structures thereon. Preferably, the calibration structure corresponds to the calibration structure described above. The tool induced shift (TIS) exhibited by the registration measurement system is determined. Preferably, the TIS is determined by measuring the displacement of the zero offset registration structure at the initial position and at 180 degrees from the initial position and, then, taking the mean of these measurements. With the wafer in the initial position, a first measurement of displacement of the zero offset registration structure is made in a given direction using the registration measurement system. The calibration structure is rotated by 90 degrees from the initial position, and a second measurement of displacement of the zero offset registration structure is made in the given direction using the registration measurement system. The calibration structure is again rotated by 180 degrees from the initial position, and a third measurement of displacement of the zero offset registration structure is made in the given direction using the registration measurement system. The calibration structure is rotated by 270 degrees from the initial position, and a fourth measurement of displacement of the zero offset registration structure is made in the given direction using the registration measurement system. Using these measurements, the tool induced shift is verified and the presence or absence of astigmatism is determined. Then, the calibration structure is repositioned in the initial position, and fifth displacement measurements for all of the zero offset and non-zero offset registration structures are made. Then, adjusted fifth displacement measurements are calculated by subtracting the fifth zero offset displacement measurement from each of the respective fifth non-zero displacement measurements. A calibration curve is derived from the adjusted fifth displacement measurements and their respective preselected offsets. The registration measurement system is adjusted using the determined tool induced shift to compensate for translational errors, e.g., tool induced shift, exhibited by the registration measurement system, and, using the calibration curve derived from the adjusted fifth displacement measurements and their respective preselected offsets, the registration measurement system is adjusted to compensate for systematic errors, e.g, magnification and distortion, exhibited by the registration measurement system.

BRIEF DESCRIPTION OF THE DRAWINGS

The foregoing and other advantages of the invention will become apparent upon reading the following detailed description and upon reference to the drawings in which:

FIG. 3 illustrates a top view of a registration structure on the calibration structure of FIG. 2;

FIG. 4 illustrates a typical cross-sectional view of the registration structure of FIG. 3 taken along line 4—4;

Figure 1:
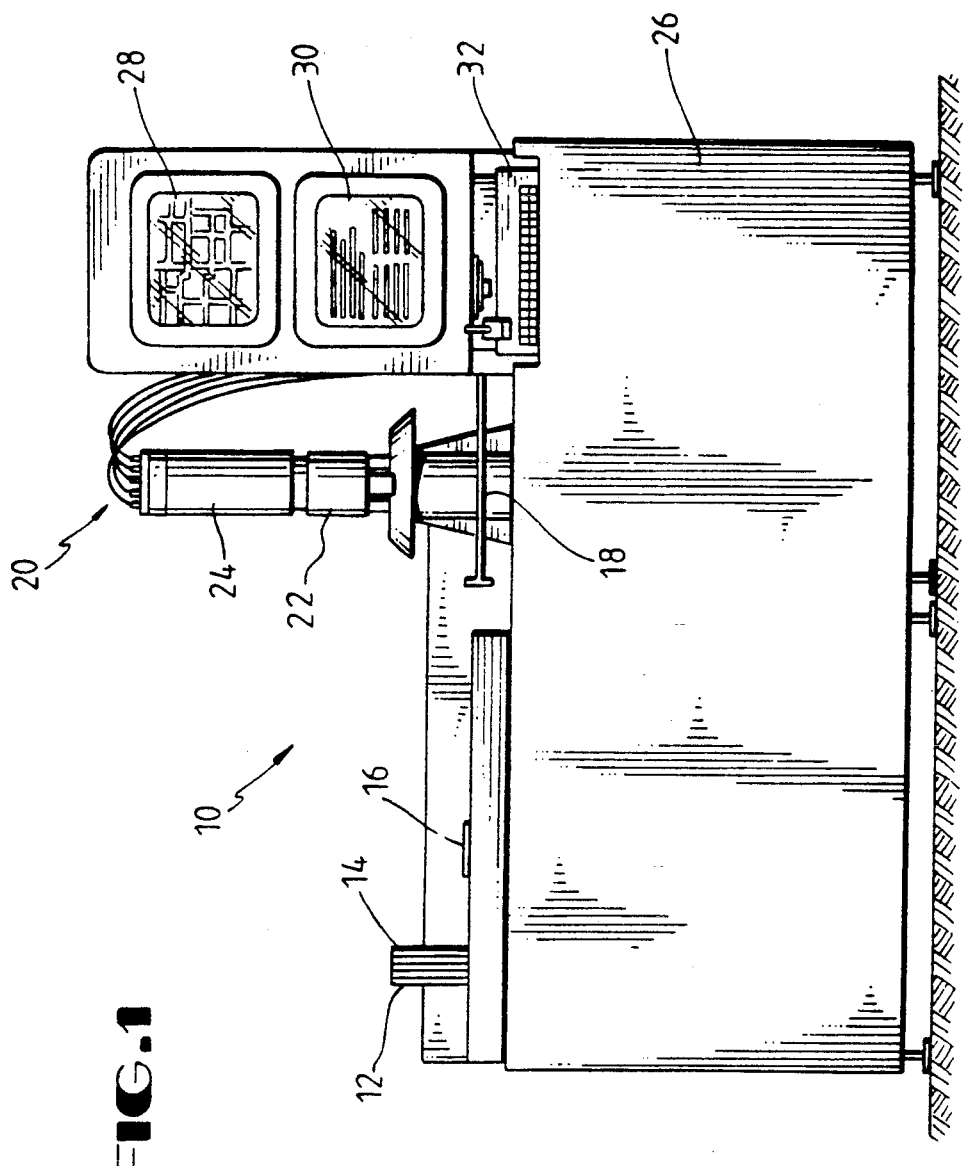
FIG. 1 illustrates an exemplary registration measurement system to be calibrated.

While the invention is susceptible to various modifications and alternative forms, specific embodiments have been shown by way of example in the drawings and will be described in detail herein. However, it should be understood that the invention is not intended to be limited to the particular forms disclosed. Rather, the invention is to cover all modifications, equivalents and alternatives following within the spirit and scope of the invention as defined by the appended claims.

DESCRIPTION OF THE PREFERRED EMBODIMENTS

Turning now to the drawings and referring initially to FIG. I, an exemplary registration measurement system (RMS) is illustrated and generally designated by the reference numeral 10. Basically, the RMS 10 facilitates the alignment of different layers in semiconductor fabrication processing. The RMS 10 includes a wafer holder 12 which contains wafers to be measured. A wafer transport pick (not shown) removes a wafer 14 from the wafer holder 12 and places it on a pre-aligner 16. The pre-aligner 16 rotates the wafer 14 to a predetermined orientation by sensing the wafer flat, i.e., the straight edge of a wafer. The wafer transport pick then transfers the wafer 14 from the pre-aligner 16 to a measurement stage 18.

An optical system, generally designated by the reference numeral 20, is mounted above the measurement stage 18 The optical system 20 includes a microscope 22 and a video camera 24 which are positioned in axial alignment with one another such that the video camera 24 records the images collected by the microscope 22. Preferably, the microscope is capable of magnifying a wafer 14 positioned on the measurement stage 18 by 2 to 200 times.

In operation, the wafer transport pick positions the wafer 14 on the stage 18 in a horizontal position such that the plane defined by the wafer 14 is perpendicular to the optical axis of the optical system 20. Preferably, the stage 18 is movable in three dimensions for positioning selected registration patterns relative to the optical system 20. Therefore, the stage 18 precisely positions the wafer 14 until the registration patterns to be measured are located directly under the microscope 22. Then, the microscope turret rotates to the desired magnification, and the video camera 24 records the focused image of the registration patterns.

The video camera 24 delivers electrical signals representative of the recorded image to an image processor (not shown) which is stored in the cabinet 26 of the RMS 10. The image processor, using known techniques, delivers the processed electrical image signals to a computer (not shown) which is also stored in the cabinet 26. The computer further processes the electrical signals received from the image processor and displays the recorded image on an image monitor 28 that is coupled to the computer. A text screen 30 and a keyboard 32 are also coupled to the computer so that an operator can instruct the computer to, among other things, determine the alignment of the various layers in response to the measurements of the registration structure. Furthermore, and more importantly for purposes of calibration, the computer associated with many registration measurement systems 10 can be programmed to accept measurement offsets or curves that the computer will access when computing registration.

Preferably, the RMS 10 and all of the described components associated therewith are commercially available. For instance, the RMS 10 could be a Model Accuvision ACV-8 available from Interactive Video System, Inc. of Concord, Mass., or a Model 2031 available from KLA Instruments, Inc. of Santa Clara, Calif. However, it is contemplated that the subsequently described calibration structure design and the method for analyzing it will facilitate the calibration and measurement of many commonly used registration measurement systems.

Figure 2:
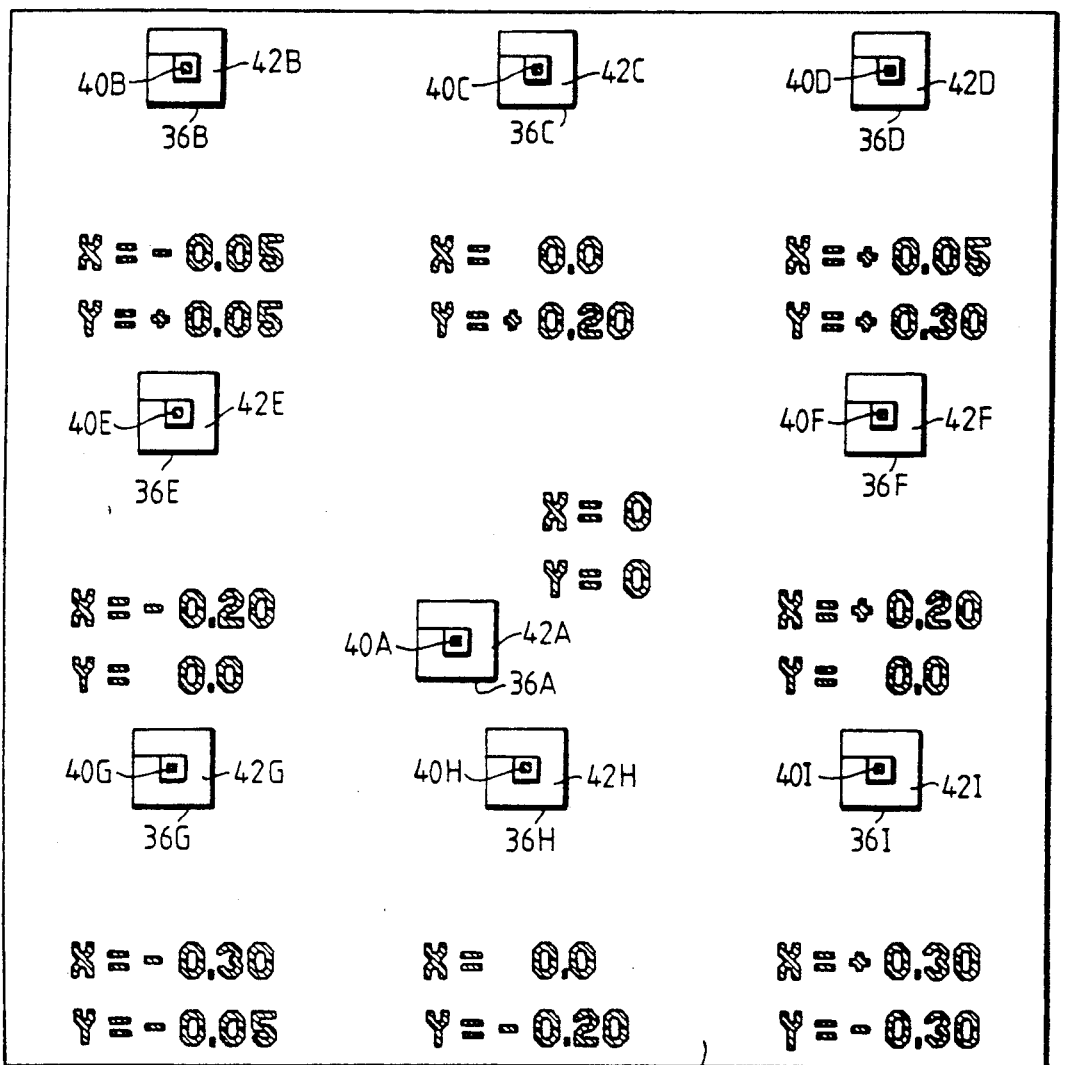
FIG. 2 illustrates an exemplary calibration structure to be used with the calibration method in accordance with the present invention.

To calibrate the RMS 10, a calibration structure is fabricated. FIG. 2 illustrates an exemplary calibration structure 34. Preferably, the calibration structure 34 includes a plurality of dual-level registration structures 36A thru I, such as those mentioned in the "BACKGROUND" section. The registration structures 36A thru I on the calibration structure 34 are designed so that measuring the registration structures 36A thru I in accordance with the calibration method discussed below facilitates accurate calibration of the RMS 10.

FIGS. 3 and 4 illustrate an exemplary registration structure 36. Each registration structure 36 includes an inner box 40 which is surrounded by an open outer box 42. As illustrated in FIG. 3, the positions of the inner box 40 and of the outer box 42 are determined with reference to a Cartesian coordinate system having an X-axis 44 and an orthogonal Y-axis 46. As illustrated, the center of the inner box 40 is concentric with the center of the outer box 42 as defined by the intersection of the X axis 44 with the Y axis 46. However, it is important to note that the dimensions of the outer periphery of the inner box 40 are sufficiently smaller than the dimensions of the opening 48 of the outer box 42, so that the inner box 40 may be positioned within the opening 48 offset from the illustrated concentric position, without adversely affecting the performance of the calibration structure 36.

The cross-sectional view of the registration structure 36 is illustrated in FIG. 4. Since each registration structure 36 is fabricated using known fabrication techniques, each step in the fabrication process of the calibration structure 34 will not be explained in detail herein. It is sufficient to notice that each registration structure 36 is formed on a substrate 38, such as a silicon wafer. The inner box 40 is formed by a base layer 50 on the substrate 38. Then, there may or may not be one or more intermediary layers 52 formed on top of the substrate 38 and base layer 50. The outer box 42 is preferably formed by a layer of photoresist 54 on top of the intermediary layer 52, if it so exists, or on the substrate 38 if there is no intermediary layer 52.

Figure 5:
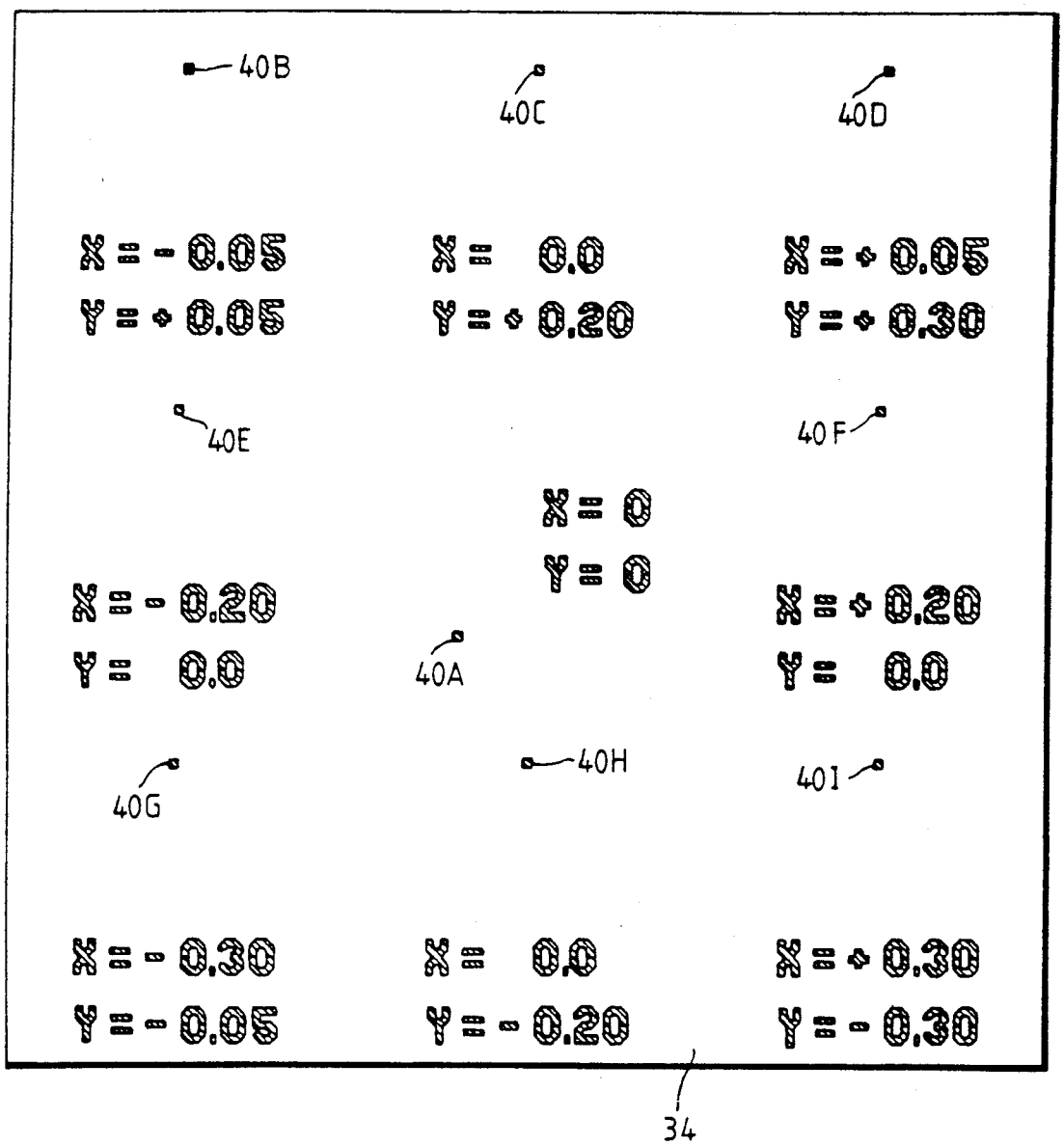
FIG. 5 illustrates inner boxes of the registration structures on a partially fabricated calibration structure.
Figure 6:
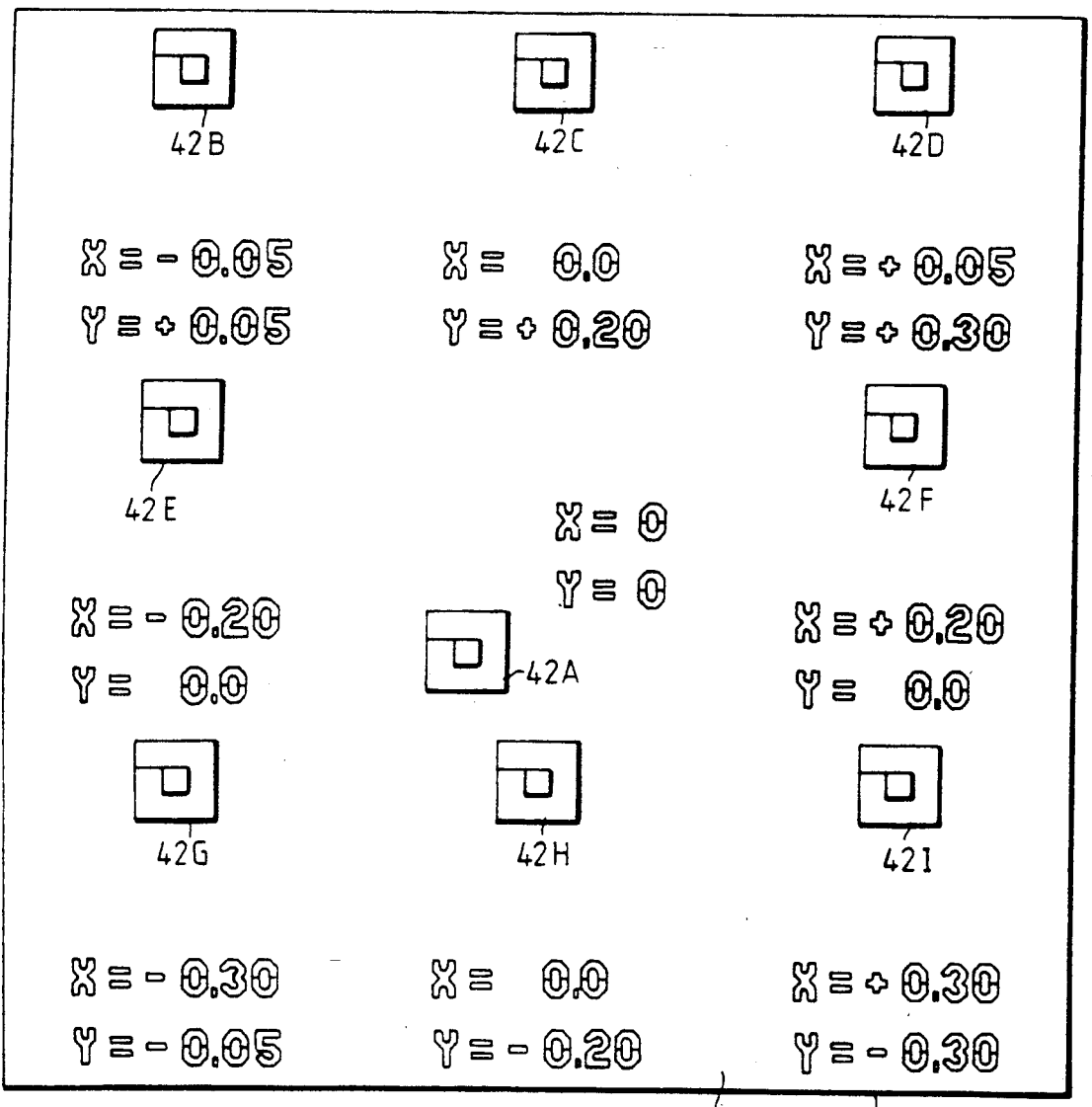
FIG. 6 illustrates outer boxes of the registration structures on a calibration structure.

By referring briefly to FIGS. 5 and 6, the reader can gain a basic understanding of the fabrication of the dual layer calibration structure 34. FIG. 5 illustrates a plurality of inner boxes 40A thru I which are formed in a base layer on the substrate 38. Once the inner boxes 40A thru I have been formed, the intermediary layer 52 may be deposited thereon. Then, as illustrated in FIG. 6, the outer boxes 42A thru I are formed in the photoresist layer 54 on the intermediary layer 52, or on the substrate 38 if there is no intermediary layer 52, at preselected locations with respect to the inner boxes 40A thru I. This fabrication process results in the formation of the calibration structure 34 illustrated in FIG. 2.

The calibration structure 34 includes one or more registration structures designed with the inner box 40 concentric with the outer box 42 such that the X, Y coordinate of the center of each registration structure is (0,0). In other words, these registration structures are designed to measure (0,0) when there are no wafer alignment errors or errors induced by the RMS 10. As illustrated in FIG. 2, only registration structure 36A is concentrically designed to measure (0,0).

The calibration structure 34 also includes a plurality of registration structures 36 that have been designed with offsets between the respective inner boxes 40 and outer boxes 42. In other words, the respective inner boxes 40 are not concentric with the outer boxes 42. As illustrated in FIG. 2, the registration structures 36B thru I are designed with various X and Y misregistrations. If there were no wafer alignment errors, or errors induced by the RMS 10, these registration structures 36B thru I should measure the preset misregistration value between the process layers as indicated on FIG. 2. To conform to typical convention, the center of the inner boxes 40 are taken to be positioned at coordinate (0,0), and the center of the outer boxes 42 are offset therefrom.

The combination of the previously described registration structures 36A thru I and their design facilitates the calibration of the RMS 10. Since mathematical equations will be used to describe the calibration method using the calibration structure 34, the registration structures 36A thru I will be designated by $S_0$ thru $S_8$, respectively. In addition, the calibration structure 34 is preferably duplicated on multiple die on the calibration wafer 14. At least one of the die should be near the center of the wafer 14 in order to minimize rotational effects, as will become apparent. The remainder of the calibration structures 34 can be located as desired in order to provide the most accurate calibration for the particular registration measurement system.

First, the X and Y components of $S_0$ for a calibration structure 34 on center die of the wafer 14 are measured using the RMS 10. Preferably, these measurements are made a statistically significant number of times. These X and Y components are preferably stored in the computer of the RMS 10. Next, the wafer 14 is rotated 180° about the optical axis from its initial position. Rotation of the wafer 14 can be accomplished by rotating the stage 18. Alternatively, the wafer could be transferred to the prealigner 16, rotated by 180°, and returned to the stage 18. Manual rotation of the wafer is also possible, but not recommended. Of course, rotating the optical system 20 by 180° with respect to the calibration structure 34 would also produce the same effect.

The measurement of displacement between patterns utilizes known signal processing techniques. The distance between the inner box 40 and the outer box 42 in FIG. 3 is determined by an analysis of the signals from the camera 24. The lines of the patterns 40 and 42 each produce a transition in a scan line signal from the camera 24. The time interval between a transition corresponding to the outer box 42 and a transition corresponding to the inner box 40 is representative of the distance between these two patterns. Signal processing techniques for analyzing the camera's image to determine displacement between pattern are well-known to those skilled in the art.

After rotating the wafer containing the calibration structure 34 by 180°, a second set of displacement measurements is obtained by measuring the X and Y components of $S_0$ of the same calibration structure 34 previously measured, a statistically significant number of times, using the RMS 10. Since the calibration structure 34 has been reversed, the direction of the displacement between the inner box 40 and the outer box 42 is reversed. If no errors were involved in the measurement, the magnitude of the displacement between these boxes would be the same for both measurements, i.e., the X component of the first measurement $X_0$ would be the same as the X component for the second measurement $X_{180}$, and the Y component of the first measurement $Y_0$ would be the same as the Y component for the second measurement $Y_{180}$. However, tool induced shift (TIS) in the RMS 10 does not change direction when the calibration structure 34 is rotated. Therefore, if the RMS 10 exhibits TIS, the second measurements will differ from the first measurements.

To calculate the TIS, the mean value of the X and Y components of $S_0$ are calculated using equations 1 and 2, as set forth below:

$$TIS_X = (X_{180} + X_0)/2 \qquad \text{Equation 1}$$

$$TIS_Y = (Y_{180} + Y_0)/2 \qquad \text{Equation 2}$$

where $\overline{X}_0, \overline{Y}_0, \overline{X}_{180}$, and $\overline{Y}_{180}$ represent the mean values of $X_0, Y_0, X_{180}$, and $Y_{180}$, respectively, resulting from the repeated statistical measurements.

Once the TIS has been calculated, it may be used to correct the measurements obtained from the RMS 10. Some registration measurement systems, such as the previously mentioned Interactive Video Systems' RMS, permits the X and Y components of the TIS to be entered so that the RMS will automatically accommodate for the TIS. However, many registration measurement systems do not possess this capability. Therefore, $TIS_X$ and $TIS_Y$ are retained for further calculations in order to eliminate tool induced shift from the measurements obtained using the registration measurement system.

To illustrate the use of equations 1 and 2, suppose that $\overline{X}_0 = -0.6$ microns and $\overline{Y}_0 = 0.3$ microns. Further suppose that $\overline{X}_{180} = 0.4$ microns and that $\overline{Y}_{180} = -0.1$ microns. Using equation 1, $TIS_X = 0.1$ microns, and, using equation 2, $TIS_Y = 0.1$ microns. Thus, RMS 10 exhibits a tool induced shift of $(-0.1, 0.1)$ which must be compensated for to obtain an accurate measurement.

It should also be understood that the $S_0$ structure for any of the die on the wafer could be measured to compute TIS. However, using the center die minimizes errors introduced by the fabrication of the calibration structures 34. For instance, if the wafer was skewed a bit during fabrication, then the calibration structures 34 fabricated on die near the periphery of the wafer 14 would likely exhibit a greater magnitude of error due to the skewing than would calibration structures 34 formed on die near the center of the wafer 14.

Once the TIS is calculated, it is entered into the RMS 10 as a correction, if possible, and then verified by repeating the measurement of $S_0$ at the angular orientations of 0°, 90°, 180°, and 270°. This verification checks for the accuracy of the TIS determination and for the presence of astigmatism. The presence of astigmatism is determined by plotting the four measurements of $S_0$ on a cartesian coordinate system. A line is then drawn between the 0° and 180° measurement coordinates. A second line is drawn between the 90° and 270° measurement coordinates. The magnitudes of the two lines drawn between their respective points is compared. The presence of astigmatism exists if the magnitudes are unequal.

If the TIS has been fully accounted for (and corrected in systems that so allow) in view of this verification, the wafer is repositioned at an angular orientation of 0°, e.g., on the wafer flat, and the displacement of each registration structure $S_0$ thru $S_8$ on each calibration structure 34 is measured. The following equations are used to adjust the X and Y components of $S_0$ thru $S_8$ for these measurements for each calibration structure 34.

For registration measurement systems with TIS correction, equations 3 and 4 are used to calculate the adjusted X and Y components.

$$X_{sn\,adj} = X_{sn} - X_{s0} \qquad \text{Equation 3}$$

$$Y_{sn\,adj} = Y_{sn} - Y_{s0} \qquad \text{Equation 4}$$

when n = 1 to 8.

For measurement systems Without TIS correction, Equations 5 and 6 are used to calculate the adjusted X and Y components.

$$X_{Sn\,adj} = X_{Sn} - TIS_X - X_{S0} \qquad \text{Equation 5}$$

$$Y_{Sn\,adj} = Y_{Sn} - TIS_Y - Y_{S0} \qquad \text{Equation 6}$$

where n'1 to 8.

The X and Y components of $S_0$ account for the local wafer alignment errors, and the X and Y components of TIS account for the tool induced shift of the RMS 10. It should be noted that the calibration structure 34 measured on each respective die should use its own $S_0$ for adjustments to the offset registration measurement structures $S_1$ thru $S_8$ of the die. Since the $S_0$ measurement is subtracted from the $S_1$ thru $S_8$ measurements of the designed offsets, the resulting adjusted X and Y components $X_{Sn\,adj}$ and $Y_{Sn\,adj}$ for each measurement for each die location represent the X and Y measurements that the RMS 10 would measure if it were free from tool induced shift and systematic errors.

Using these adjusted X and Y components $X_{Sn\,adj}$ and $Y_{Sn\,adj}$ that are derived from the previously described measurements, calibration equations or curves can be derived and used to adjust raw registration measurement values to accurate final values for all device designs using the same process level as the calibration structure 34. Preferably, the designed values of X and Y are plotted versus the measured values of X and Y, and equations of best fit are calculated, preferably using a least squares determination. The calibration curves are linear and defined by the equation $y = mx + b$, where y is the designed or preselected offset, x is the measured offset, and m and b are constants that represent systematic errors.

In registration measurement systems having TIS correction, the equations of best fit are the calibration equations to be used for the process configuration being measured. For systems without TIS correction, TIS is recalculated, as set forth previously, using the equations of best fit to determine the final TIS values. Then, the equations of best fit are adjusted by subtracting the final TIS values to yield the calibration equations. The calibration equations are input to the computer of the RMS 10, so that image data received from the camera 24 is automatically adjusted by the computer to compensate for the errors present in the RMS 10.

The calibration structure and method described above offers several advantages. First, the calibration is performed on identical structures (with the exception of the designed offsets) to those that will be used for final measurements, thereby allowing direct calibration. In other words, the registration structures used to measure alignment between different process levels during wafer fabrication are substantially identical to the registration measurement structures 36A thru I that are used on the calibration structure 34.

Second, the calibration method uses the RMS 10 and relies on no other measurement systems. Therefore, the errors introduced by other measurement systems are not compounded during calibration. Third, the calibration method incorporates process topography and is insensitive to intermediary steps. Therefore, the calibration method can apply to all process levels that can be measured. Fourth, once calibration curves have been determined for a particular process level, these calibration curves can be used to adjust for the measurement of all device designs using the same process level. These advantages result in more accurate calculations of "in the process" layer-to-layer registrations. The improvements in accuracy as a result of this calibration method enable better control of registrations, and, thus, result in higher yields of operative semiconductor devices.

We claim:

1. A calibration structure for use in calibrating a registration measurement system, said calibration structure being formed by integrated circuit fabrication process steps and comprising:

a first registration structure formed on a substrate and having a first pattern and a second pattern as viewed from a point perpendicular to a plane generally defined by said substrate, wherein each of said first and second patterns has a center, and wherein the displacement between the centers of said first and second patterns is selected to be zero, absent any misalignment induced by said integrated circuit fabrication process steps; and a plurality of second registration structures formed on said substrate and located on said substrate in spaced apart relation to one another and to said first registration structure, each of said second registration structures having a third pattern and a fourth pattern, wherein each of said third and fourth patterns have a center, and wherein the displacement between the centers of each said third pattern and its respective fourth pattern is selected to be of a known non-zero magnitude and a known direction, absent any misalignment induced by said integrated circuit fabrication process steps.

2. The calibration structure, as set forth in claim 1, wherein said first registration structure comprises:

a first layer on said substrate forming said first pattern;

an intermediary layer covering said first pattern; and a second layer on said intermediary layer forming said second pattern.

3. The calibration structure, as set forth in claim 2, wherein each of said second registration structures comprise:

a first layer on said substrate forming said third pattern;

an intermediary layer covering said third pattern; and a second layer on said intermediary layer forming said fourth pattern.

4. The calibration structure, as set forth in claim 1, wherein said first registration structure comprises:

a first layer on said substrate forming said first pattern; and a second layer on said substrate forming said second pattern.

5. The calibration structure, as set forth in claim 4, wherein each of said second registration structures comprise:

a first layer on said substrate forming said third pattern; and a second layer on said substrate forming said fourth pattern.

6. The calibration structure, as set forth in claim 1, wherein:

said second pattern is rectangular having an opening therein and said first pattern is rectangular and positioned within said opening; and each of said fourth patterns is rectangular having an opening therein and each of said respective third patterns is rectangular and positioned within said respective opening.

7. The calibration structure, as set forth in claim 1, wherein said displacement between said center of said first pattern and said center of said second pattern and between each center of said third patterns and said respective center of said fourth patterns is determined with reference to respective, orthogonal, intersecting X and Y axes defined as lying in said plane.

8. The calibration structure, as set forth in claim 7, wherein the intersection of each of said respective X and Y axis define an x, y coordinate (0, 0), and wherein said centers of each of said first and third patterns is located at x, y coordinate (o, o) of its respective X and Y axis.

9. A method for calibrating a registration measurement system, said method comprising the steps of:

determining any tool induced shift exhibited by said registration measurement system and if said registration measurement system can accept tool induced shift corrections, adjusting said registration measurement system for said determined tool induced shift;

positioning a calibration structure on said registration measurement system in an initial position, said calibration structure having thereon a registration structure having a preselected zero offset, and a plurality of registration structures having respective preselected non-zero offsets;

making a first measurement of displacement of said zero offset registration structure in a given direction using said registration measurement system;

rotating said calibration structure by 90 degrees from said initial position;

making a second measurement of displacement of said zero offset registration structure in said given direction using said registration measurement system;

rotating said calibration structure by 180 degrees from said initial position;

making a third measurement of displacement of said zero offset registration structure in said given direction using said registration measurement system;

rotating said calibration structure by 270 degrees from said initial position;

making a fourth measurement of displacement of said zero offset registration structure in said given direction using said registration measurement system;

verifying said tool induced shift determination and checking for any astigmatism in response to said first, second, third, and fourth measurements;

rotating said calibration structure to said initial position;

making a fifth measurement of displacement of each of said registration structures in said given direction using said registration measurement system;

calculating adjusted fifth displacement measurements for said non-zero offset registration structures by subtracting said fifth zero offset displacement measurement from each of said respective fifth non-zero displacement measurements, and if said registration measurement system cannot accept tool induced shift corrections, subtracting said determined tool induced shift from each of said respective fifth non-zero displacement measurements;

deriving a calibration curve from said adjusted fifth displacement measurements and said respective preselected zero and non-zero offsets; and adjusting said registration measurement system using said calibration curve to compensate for systematic errors exhibited by said registration measurement system and to compensate for tool induced shift if said determined tool induced shift was subtracted from each of said respective fifth non-zero displacement measurements.

10. The method, as set forth in claim 9, wherein said step of determining said tool induced shift is accomplished by:
   positioning said calibration structure on said registration measurement system in said initial position;
   making an initial measurement of displacement of said zero offset registration structure in said given direction using said registration measurement system;
   rotating said zero offset registration structure by 180 degrees from said initial position;
   making a subsequent measurement of displacement of said zero offset registration structure in said given direction using said registration measurement system; and
   calculating any tool induced shift exhibited by said registration measurement system in response to said initial and subsequent measurements.

11. The method, as set forth in claim 10, wherein said step of calculating tool induced shift is accomplished using the equation:

$$TIS = (D_{180} \pm D_0)/2;$$

where TIS represents said tool induced shift, $D_{180}$ represents said subsequent displacement measurement, and $D_0$ represents said initial displacement measurement.

12. The method, as set forth in claim 11, wherein said step of adjusting said registration measurement system using said determined tool induced shift is accomplished by:
   deriving a TIS calibration curve from said equation; and
   altering measurement made by said registration measurement system in accordance with said TIS calibration curve.

13. The method, as set in claim 9, wherein said step of calculating adjusted fifth displacement measurements is accomplished using the equation, if said registration measurement system cannot accept tool induced shift corrections:

$$D_{Sn\ adj} = D_{Sn} - TIS - D_{S0};$$

where n represents one of said respective non-zero registration structures; $D_{Sn\ adj}$ represents the respective fifth adjusted displacement measurement for one of said non-zero offset registration structures; $D_{Sn}$ represents the respective fifth displacement measurement for one of said non-zero offset registration structures; TIS represents said tool induced shift; and $D_{S0}$ represents the fifth displacement measurement for said zero offset registration structure.

14. The method, as set forth in claim 9, wherein said step of calculating adjusted fifth displacement measurements is accomplished using the equation, if said registration measurement system can accept tool induced shift corrections:

$$D_{Sn\ adj} = D_{Sn} - D_{S0};$$

where n represents one of said respective non-zero registration structures; $D_{Sn\ adj}$ represents the respective fifth adjusted displacement measurement for one of said non-zero offset registration structures; $D_{Sn}$ represents the respective fifth displacement measurement for one of said non-zero offset registration structures; and $D_{S0}$ represents the fifth displacement measurement for said zero offset registration structure.

15. A method for calibrating a registration measurement system, said method comprising the steps of:
   positioning a calibration structure on said registration measurement system in an initial position, said calibration structure having thereon a registration structure having a preselected zero offset and a plurality of registration structures having respective preselected non-zero offsets;
   making a first measurement of displacement of said zero offset registration structure in a given direction using said registration measurement system;
   rotating said zero offset registration structure by 180 degrees from said initial position;
   making a second measurement of displacement of said zero offset registration structure in said given direction using said registration measurement system;
   calculating a measurement shift induced by said registration measurement system in response to said first and second measurements;
   adjusting said registration measurement system to compensate for said induced shift;
   rotating said calibration structure to said initial position;
   making a third measurement of displacement of said zero offset registration structure in said given direction using said registration measurement system;
   rotating said registration structures by 90 degrees from said initial position;
   making a fourth measurement of displacement of said zero offset registration structure in said given direction using said registration measurement system;
   rotating said registration structures by 180 degrees from said initial position;
   making a fifth measurement of displacement of said zero offset registration structure in said given direction using said registration measurement system;
   rotating said registration structures by 270 degrees from said initial position;
   making a sixth measurement of displacement of said zero offset registration structure in said given direction using said registration measurement system;
   verifying said calculated measurement shift and checking for any astigmatism in response to said third, fourth, fifth and sixth measurements;
   rotating said calibration structure to said initial position;
   making a seventh measurement of displacement of each of said registration structures in said given direction using said registration measurement system;
   calculating adjusted seventh displacement measurements for said non-zero offset registration structures by subtracting said seventh zero offset displacement measurement from each of said respective seventh non-zero displacement measurements;
   deriving a calibration curve from said adjusted seventh displacement measurements and said respective preselected zero and non-zero offsets; and
   adjusting said registration measurement system using said calibration curve to compensate for systematic errors exhibited by said registration measurement system.

16. The method, as set forth in claim 15, wherein said step of calculating a measurement shift is accomplished using the equation:

$$TIS = (D_{180} \pm D_0)/2;$$

where TIS represents said measurement shift, $D_{180}$ represents said second displacement measurement, and $D_0$ represents said first displacement measurement.

17. The method, as set forth in claim 15, wherein said step of calculating adjusted seventh displacement measurements is accomplished using the equation:

$$D_{Sn\ adj} = D_{Sn} - D_{S0};$$

where n represents one of said respective non-zero registration structures; $D_{Sn\ adj}$ represents the respective adjusted seventh displacement measurement for one of said non-zero offset registration structures; $D_{Sn}$ represents the respective seventh displacement measurement for one of said non-zero offset registration structures; and $D_{so}$ represents the seventh displacement measurement for said zero offset registration structure.

18. The method, as set forth in claim 15, wherein said step of adjusting said registration measurement system to compensate for said induced shift is accomplished by:

deriving a TIS calibration curve from said equation; and altering measurements made by said registration measurement system in accordance with said TIS calibration curve.

* * * * *

UNITED STATES PATENT AND TRADEMARK OFFICE
CERTIFICATE OF CORRECTION

PATENT NO. : 5,280,437
DATED : January 18, 1994
INVENTOR(S) : Daniel A. Corliss

It is certified that error appears in the above-indentified patent and that said Letters Patent is hereby corrected as shown below:

Column 8, line 68, "$TIS_X = (X_{180}+X_0)/2$" should be --$TIS_X = (\bar{X}_{180}+\bar{X}_0)/2$--.

Column 9, line 1, "$TIS_Y = (Y_{180}+Y_0)/2$" should be --$TIS_Y = (\bar{Y}_{180}+\bar{Y}_0)/2$--.

Column 9, line 20, "0.1" should be -- -0.1--.

Column 9, line 65, "Without" should be --without--.

Column 13, line 38, after "set" add --forth--.

Signed and Sealed this

Thirty-first Day of May, 1994

Attest:

BRUCE LEHMAN

*Attesting Officer*       *Commissioner of Patents and Trademarks*